United States Patent [19]

Thawley et al.

[11] 4,259,002
[45] Mar. 31, 1981

[54] PLATE PROCESSING APPARATUS

[76] Inventors: Clive S. Thawley, 5 Robertson Ave., Dumfried, Scotland; Kenneth Graham, 14 Canterbury Ave., Lowton Saint Lukes, Near Warrington, England; Austin Brittain, 25 Minden Crescent, Georgetown Rd., Dumfries, Scotland

[21] Appl. No.: 119,242

[22] Filed: Feb. 7, 1980

[30] Foreign Application Priority Data

Feb. 9, 1979 [GB] United Kingdom ............... 04704/79

[51] Int. Cl.³ ............................................ G03D 5/02
[52] U.S. Cl. .................................... 354/319; 354/325; 354/326; 134/72; 134/102; 134/200
[58] Field of Search ............... 354/297, 317, 319, 323, 354/325, 331, 332, 337, 306, 311, 322, 326; 134/72, 125, 126, 131, 143, 165, 183, 200, 102, 113

[56] References Cited

U.S. PATENT DOCUMENTS

| 4,015,615 | 4/1977 | Weber | 134/200 |
| 4,197,000 | 4/1980 | Blackwood | 354/323 |

FOREIGN PATENT DOCUMENTS 2518994 11/1976 Fed. Rep. of Germany ........... 134/200

Primary Examiner—Donald A. Griffin
Assistant Examiner—Alan Mathews
Attorney, Agent, or Firm—Charles A. Blank

[57] ABSTRACT

Apparatus for simultaneously treating the surfaces of a plurality of exposed photopolymer printing plates supported one above another by racks on a trolley. The trolley may be moved by a conveyor 18 from a first compartment 6 to a second compartment 7 separated by a curtain door 11. The first compartment has a series of ultra-violet sources 26 interdigitating with the plates to expose these and a hot air supply 34, 35 for driving solvent from the plates. The second compartment has spray means 29 interdigitating with the plates to spray detackifying solution thereon and a hot air supply 34, 35 for drying the plates after detackifying.

13 Claims, 4 Drawing Figures

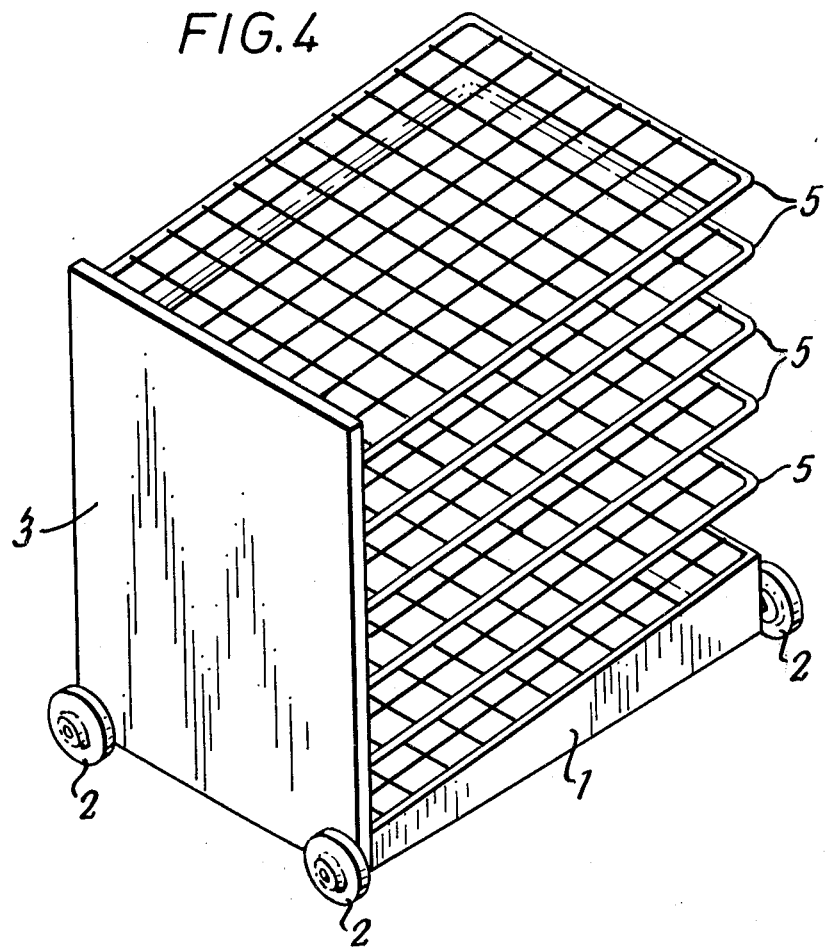

PLATE PROCESSING APPARATUS

This invention relates to apparatus for simultaneously treating a plurality of plates in a number of sequential steps.

There are many fields wherein it is necessary to treat the surface of a plate by a succession of processes, and many methods of handling the plate during that treatment have been used. It is an object of the present invention to provide a compact apparatus which can be used for the simultaneous processing of a plurality of plates.

According to the present invention, apparatus for simultaneously treating a plurality of plates comprises a carrier for supporting the plates in spaced relationship one above another, an enclosure having first and second compartments each capable of accommodating the carrier loaded with the plates, a door closing the compartments one from the other, means for opening the door to allow transfer of the carrier from the first to the second compartment, means for effecting transfer of the carrier from the first to the second compartment, and first and second plate treatment systems associated respectively with the first and second compartments, at least one of the treatment systems comprising a series of treatment means mounted one above another in the respective compartment to interdigitate with the plates on the carrier.

By arranging a tier of treatment means in a compartment, and passing a tier of plates on a carrier through the compartment it will be seen that all plates on the carrier can be simultaneously treated in a simple and effective manner. Furthermore, the use of two compartments enables overall processing to be further speeded up since different operations can be effected simultaneously in the two compartments. It would be possible to use more than two compartments with each pair of adjacent compartments separated by a respective door so that where a multiplicity of different treatment processes are required one or more processes can be taking place simultaneously in each of the compartments, the plates being moved through the compartments in sequence.

The individual treatment systems will be designed according to the processes to which the plates need to be directed. One or more different types of processing systems may be associated with each compartment and any one such system may include air injection means for directing hot air into the respective compartment and air extraction means for extracting air from that compartment. For certain processes each compartment may have a series of treatment means mounted to interdigitate with the plates on the carrier, and each compartment may also have air injection and extraction means.

One particular process in which the apparatus may be used is the finishing of photopolymer printing plates. Such plates have been exposed through a negative to ultraviolet light and the areas so exposed have hardened due to that exposure, leaving soft unexposed areas between the hardened areas. After this exposure the soft material is then brushed out from the surface of the plate by means of a solvent applied in a brushing unit, so giving a plate with a relief printing surface. Remaining solvent needs to be removed from that surface and the surface must then be fully hardened by exposing it to ultra-violet radiation. After such exposure the surface must be detackified followed by further drying. In this particular context apparatus according to the invention for simultaneously treating the exposed surfaces of a plurality of exposed photopolymer printing plates comprises a series of first treatment means spaced one above another in the first compartment to interdigitate with the plates on the carrier, each first treatment means being capable of directing ultra-violet radiation on to the surfaces of plates supported adjacent thereto by the carrier, and a series of second treatment means spaced one above another in the second compartment to interdigitate with the plates on the carrier, each second treatment means being spray means for spraying liquid on to the surfaces of plates supported by the carrier adjacent to the spray means.

In this context, and indeed in the context of any processing which involves spraying liquid onto the surface of a plate, the carrier preferably supports each plate at a small angle to the horizontal and each treatment means is disposed at a similar angle. This ensures that liquid drains properly from the surfaces of the plates. An angle of from 2° to 15° has been found suitable for this purpose, with a preferred range of from 5° to 10°.

Preferably the door between adjacent compartments is a curtain door of flexible material which is capable of being raised and lowered by a roller.

Any suitable form of transfer means for moving the carrier from one compartment to another can be used and conveniently this takes the form of a conveyor on which the carrier rests.

In order that the invention may be better understood a specific embodiment thereof will not be described in more detail, by way of example only, with reference to the accompanying drawings in which:

FIG. 4 is a diagrammatic representation of a trolley suitable for use in the invention.

Figure 1:
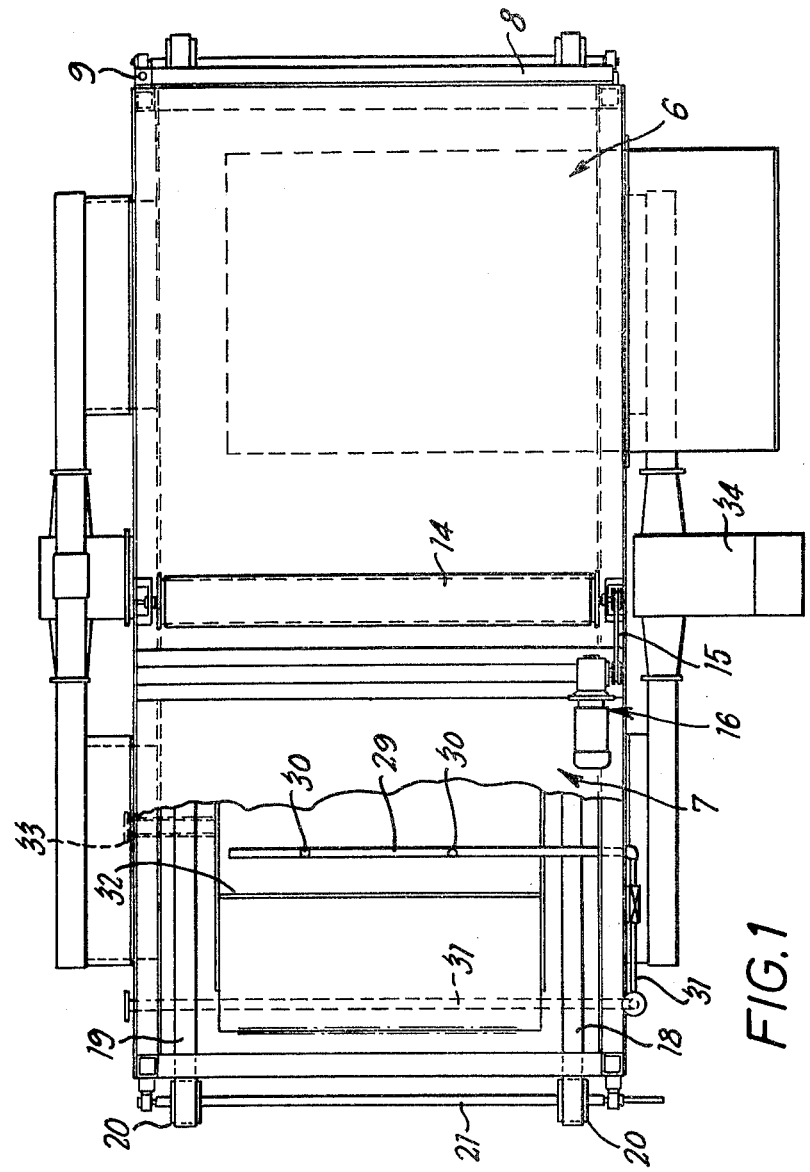
FIG. 1 is a top plan view of the apparatus with parts cut away.

Referring first to FIG. 4 this shows a trolley having an open base frame 1, wheels 2, and an end wall 3. Supported by the end wall 3 are a plurality of racks 5 each capable of supporting a plate, not shown in the drawings, each rack having a mesh support surface and being inclined to the end wall 3 at an angle of from 80° to 85°. The upper surface of the base 1 is formed by a similarly inclined mesh support.

Figure 2:
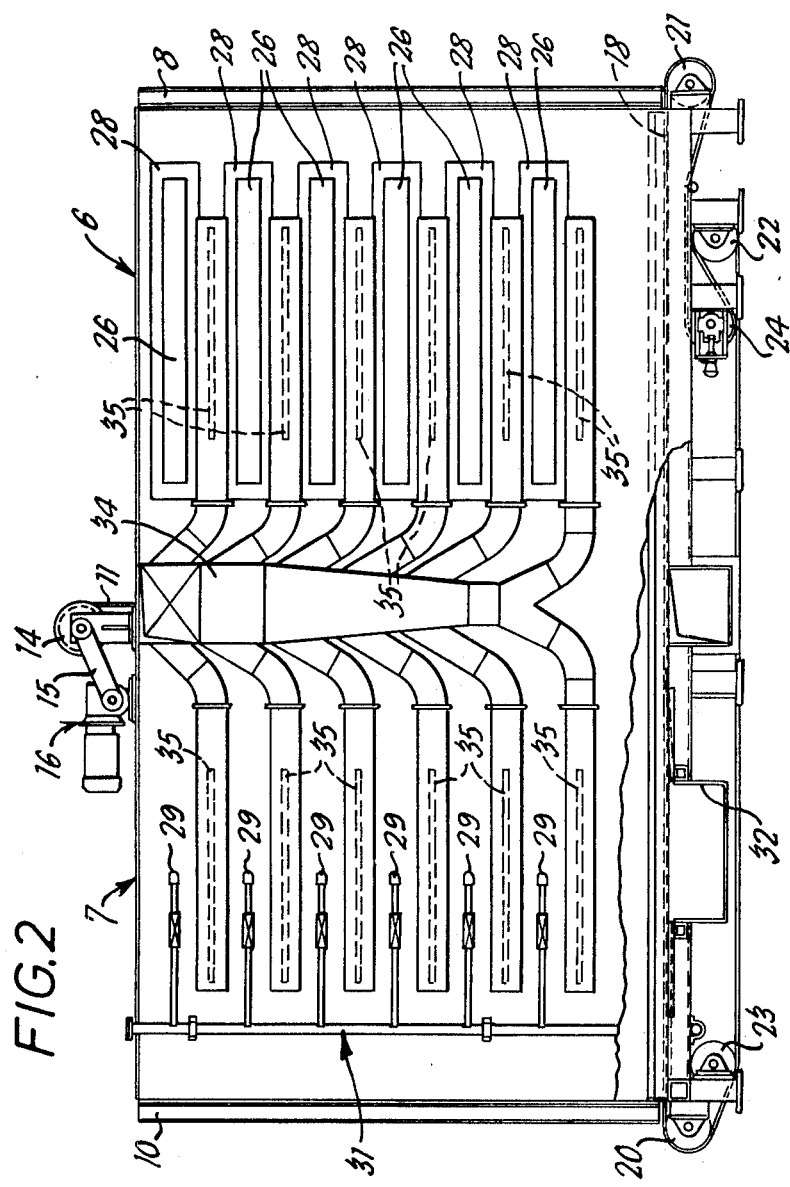
FIG. 2 is a side elevation of the apparatus with parts cut away.
Figure 3:
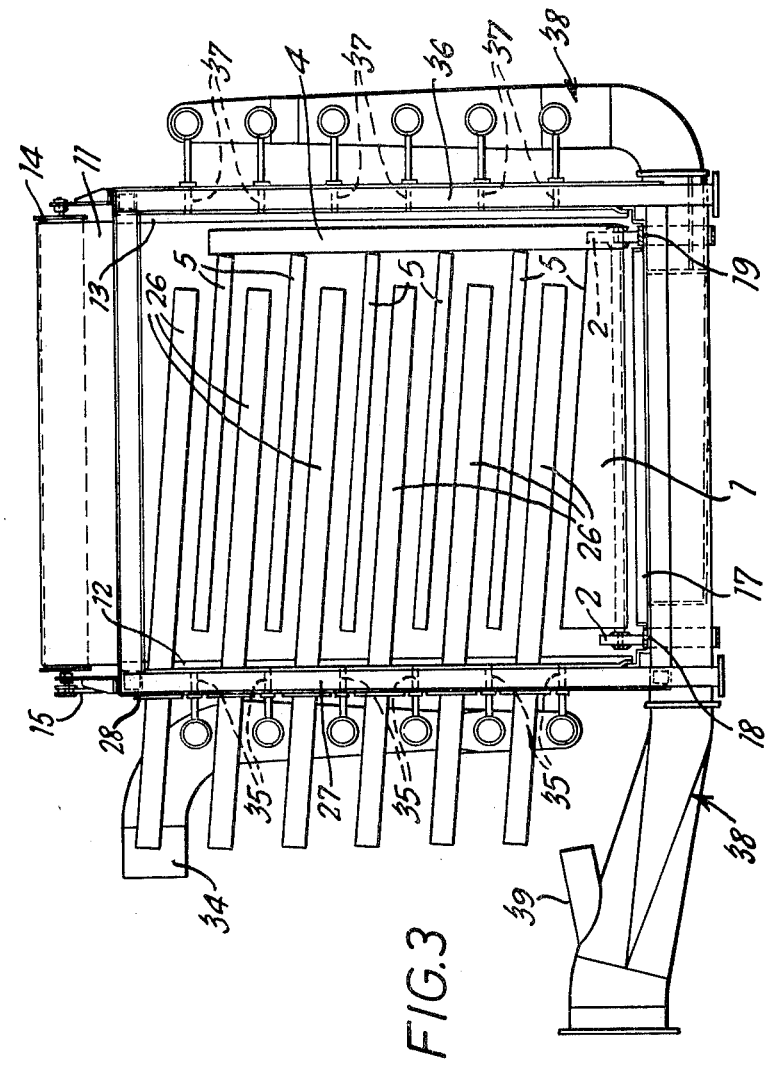
FIG. 3 is an elevation taken on one end of the apparatus with parts removed for clarity.

As shown in FIGS. 1 and 3 the apparatus includes an enclosure divided into first and second compartments shown generally as 6 and 7 and each defined by a base, top wal and side walls. The free end of the compartment 6 can be closed by a door 8 hinged to one of the side walls at 9. The free end of the compartment 7 may be closed by a door 10 which is similarly hinged to the same side wall. The compartments are sealed one from the other by a center door constituted by a heavy fabric curtain 11 passing through a slot in the top of the enclosure and having its sides engaged in guides 12 and 13 within the enclosure. The curtain door is wrapped around a roller 14 rotatably mounted on the top of the enclosure and capable of being rotated in either direction by a belt drive 15 from a motor and gear box assembly 16. Rotation of the roller 14 counterclockwise as shown in FIG. 2 raises the curtain to open the door, while rotation in a clockwise direction lowers the curtain and so closes the door.

The floor 17 of the enclosure is recessed at each side thereof to accommodate the upper runs of two conveyor belts 18 and 19. The support and drive arrangement for each belt is identical and only that for belt 18 will be described in detail. The belt 18 passes around a drive pulley 20 at one end of the enclosure, around an idler pulley 21 at the opposite end of the enclosure and around further idler pulleys 22 and 23. The belt also passes around a tensioning pulley 24 which is mounted so that its distance from the idler pulley 22 can be adjusted and set as required. The drive pulleys 20 for both the belts 18 and 19 are fixed to a common drive shaft 21 to which may be coupled a motor (not shown).

Located in the first compartment 6 are a first series of treatment means 26 arranged one above another in spaced relationship so that they interdigitate with plates supported on the racks 5 of the trolley. Each of the treatment means 26 comprises a carrier which is inserted into the compartment through a slot in the side wall 27 and has a flange 28 which is bolted to the side wall 27 and has a flange 28 which is bolted to the side wall by bolts (not shown). The part of the carrier within the compartment 6 supports a plurality of ultra-violet tubes mounted and arranged so that they will irradiate the whole of the surface of a plate mounted on the rack 5 lying immediately beneath the respective carrier. The section of the carrier lying outside the compartment carries the control equipment for the ultra-violet tubes. The carriers 26, in addition to support the tubes, at as shields so that radiation is only directed downwardly.

The second compartment houses a second series of treatment means comprising a series of pipes 29 with spray openings 30 formed therein. Only two such openings are shown in FIG. 1, but it will be understood that there are a plurality of such openings spaced along the length of pipes 29. The pipes 29 are spaced one above another in the compartment 7 to interdigitate with plates mounted on the racks 5 of the trolley. Each of the pipes 29 is connected by further pipe work shown generally as 31 to a liquid supply tank and pump. The floor of the second compartment 7 is provided with a drainage well 32 from which excess liquid may be removed by a drain pipe 33. It will be noted that the racks 5 are inclined at a small angle, desirably of from 5° to 10°, to the horizontal to ensure that liquid will drain from the surface of plates supported on those racks. Because of this each of the pipes 29 is inclined at a similar angle, and each of the carriers 26 supporting the ultra-violet tubes is also inclined at the same angle.

A hot air supply is coupled to duct work 34 at one side of the enclosure. The duct work has branches as shown in the drawings, each branch terminating in an elongating nozzle 35 that extends through the side wall 27 of the respective compartment. It will be noted that the nozzles 35 alternate with the carriers 26 in the compartment 6 and alternate with the pipes 29 in the compartment 7. The opposite wall 36 of the enclosure is formed with elongated outlet openings 37 opening into further ducting shown generally as 38 and constituting part of air extraction means for removing air from the compartment. The air can be re-circulated to a heater and blower to re-enter the compartments through the ducting 34. If desired part of the extracted air may be bled from the system through a bleed opening 39 if volatile solvents are to be removed from the system.

Operation of the apparatus will now be described in the context of processing exposed photopolymer printing plates, which have been exposed through a negative and have had the unexposed regions washed out from the plate with a suitable solvent. The washed plates are stacked on the racks 5 of the trolley with the exposed surfaces uppermost, the door 8 is opened and the trolley is wheeled into the first compartment 6. The door is then closed and the air supply is switched on to direct hot air into the compartment 6 through the nozzles 35. This flow of air dries the surfaces of the plates and evaporates the solvent therefrom, the cooler air and solvent being exhausted through the ducting 38. After a period sufficient to complete the drying operation the air supply is stopped and the ultra-violet tubes in the carriers 26 are then switched on in order to irradiate the exposed surfaces of the plates. This irradiation completes the hardening of the whole of the plate surface. After the required period of irradiation the ultra-violet tubes are switched off and the motor 16 is operated to raise the curtain door 11. When this has been completely raised the conveyor is driven to transfer the trolley from the compartment 6 into the compartment 7. When transfer is complete the motor 16 reverses and acts to lower the curtain door 11. After such closure a suitable detackifying solution is sprayed from the pipes 29 onto the surfaces of the plates. The nozzles are designed so that the whole of the surfaces is uniformly sprayed. Excess liquid runs off the plates due to their inclination to the horizontal and collects in the well 32 from where it is removed by way of drain 33. When the spraying operation is complete a blast of air may be directed through the pipe work 31 and pipes 29 to ensure that remaining liquid is removed from the system and does not drip on to the plate surfaces. When spraying has been completed the hot air supply is switched on to dry the surfaces of the plates in compartment 7, air being extracted from the compartment in the same way as from compartment 6. The door 10 is then opened and the trolley with the fully processed and dried plates is removed from the compartment 7.

It will be understood that as soon as the trolley has been moved from the compartment 6 into the compartment 7 the door 8 may be opened and a second trolley inserted into the compartment 6. The processing cycle on the plates in the compartment 6 may then take place simultaneously with the processing cycle on the plates in the trolley in compartment 7. Substantially continuous use may thus be made of both bays.

It will be understood that control mechanisms and limit switches or other sensing devices may be incorporated in the apparatus for controlling the sequence of operation of the various parts thereof. Design of these will be readily apparent to one skilled in the art and they are not described in detail herein. It is found that the drying operation in each compartment takes the longest time and the sequence of operation may thus be arranged so that when both compartments are full there is a rest time in the first compartment while spraying is effected in the second compartment. Drying is then effected in both compartments and following that there is a rest time in the second compartment while irradiation is completed in the first compartment. If it is desired to avoid rest times in the compartments the hot air supply and extraction system may be divided so that there is a separate system for each compartment and the two systems may then be separately controlled as required. The invention has been described in the specific context of the treatment of exposed photopolymer printing plates, but it will be apparent that it is not so limited. Thus, the particular treatment means in the two compartments may be varied from those shown and either compartment may have the hot air supply and extraction system omitted. The apparatus is not limited to the provision of two compartments only and other compartments may follow the second one, with further specific treatment means mounted therein. In such case there will be a separating door between each pair of adjacent compartments and the conveying means will extend the full length of the apparatus so that trolleys may be moved sequentially through all the compartments.

Clearly the plate carrier may take a different form from the trolley described and both the conveying system and the intermediate door between compartments may take any one of a number of different forms.

In a modified form of the invention the series of treatment means mounted one above another in one of the compartments may be omitted, and that compartment may have merely a hot air drying and extraction system associated therewith.

We claim:

1. Apparatus for simultaneously treating the surface of a plurality of plates, the apparatus comprising a carrier for supporting the plates in spaced relationship one above another, an enclosure having first and second compartments each capable of accommodating the carrier loaded with the plates, a door closing the compartments one from the other, means for opening the door to allow transfer of the carrier from the first to the second compartment, means for effecting transfer of the carrier from the first to the second compartment, and first and second plate treatment systems associated respectively with the first and second compartments, at least one of the treatment systems comprising a series of treatment means mounted one above another in the respective compartment to interdigitate with the plates on the carrier.

2. Apparatus according to claim 1 in which each treatment system comprises a series of treatment means mounted one above another in the respective compartment to interdigitate with the plates on the carrier.

3. Apparatus according to claim 1 in which at least one of the treatment systems comprises air injection means for directing hot air into, and extracting air from, the respective compartment.

4. Apparatus according to claim 1 in which one of the series of treatment means comprises a series of spray means spaced one above another in the respective compartment for spraying liquid on to the surfaces of plates supported by the carrier adjacent to those spray means.

5. Apparatus according to claim 4 in which the carrier is such that it supports each plate at an angle to the horizontal.

6. Apparatus according to claim 5 in which the angle is from 2° to 15°.

7. Apparatus according to any of the preceding claims in which one of the series of treatment means comprises means for directing radiation on to the surfaces of plates supported by the carrier adjacent to the radiation means.

8. Apparatus for simultaneously treating the exposed surfaces of a plurality of exposed photopolymer printing plates, the apparatus comprising a carrier for supporting the plates in spaced relationship one above another, an enclosure having first and second compartments each capable of accommodating the carrier loaded with the plates, a door closing the compartments one from the other, means for opening the door to allow transfer of the carrier from the first to the second compartment, means for effecting transfer of the carrier from the first to the second compartment, a series of first treatment means spaced one above another in the first compartment to interdigitate with the plates on the carrier, each first treatment means being capable of directing ultra-violet radiation on to the surfaces of plates supported adjacent thereto by the carrier, and a series of second treatment means spaced one above another in the second compartment to interdigitate with the plates on the carrier, each second treatment means being spray means for spraying liquid on to the surfaces of plates supported by the carrier adjacent to the spray means.

9. Apparatus according to claim 8 and including air injection means for directing hot air into, and extracting air from, at least the second compartment.

10. Apparatus according to claim 8 in which the carrier is such that it supports each plate at an angle to the horizontal.

11. Apparatus according to claim 10 in which the angle is from 2° to 15°.

12. Apparatus according to claim 1 or claim 8 in which the door between the first and second compartments is a curtain door of flexible material, and means are provided for winding the curtain onto and from a roller to open and close the door.

13. Apparatus according to claim 1 or claim 8 in which the means for effecting transfer of the carrier is a conveyor on which the carrier may rest.

* * * * *